(12) United States Patent
Ikeda

(10) Patent No.: US 11,729,912 B2
(45) Date of Patent: Aug. 15, 2023

(54) WIRING SUBSTRATE AND METHOD FOR MANUFACTURING WIRING SUBSTRATE

(71) Applicant: IBIDEN CO., LTD., Gifu (JP)

(72) Inventor: Kosuke Ikeda, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 70 days.

(21) Appl. No.: 17/388,134

(22) Filed: Jul. 29, 2021

(65) Prior Publication Data

US 2022/0046795 A1 Feb. 10, 2022

(30) Foreign Application Priority Data

Aug. 6, 2020 (JP) .................................. 2020-134185

(51) Int. Cl.
| | | |
|---|---|---|
| H05K 1/03 | (2006.01) | |
| H05K 1/11 | (2006.01) | |
| H05K 3/38 | (2006.01) | |
| H05K 3/10 | (2006.01) | |

(52) U.S. Cl.
CPC ............. *H05K 1/119* (2013.01); *H05K 3/381* (2013.01); *H05K 1/0373* (2013.01); *H05K 3/108* (2013.01); *H05K 2201/0344* (2013.01)

(58) Field of Classification Search
CPC ........................... H05K 1/0353; H05K 1/0373
See application file for complete search history.

(56) References Cited

U.S. PATENT DOCUMENTS

2009/0314526 A1* 12/2009 Nagasawa .............. H05K 3/381
174/262
2012/0125667 A1* 5/2012 Jung .................... H05K 3/4652
174/251

FOREIGN PATENT DOCUMENTS

JP 2017-199703 A 11/2017

* cited by examiner

*Primary Examiner* — Jeremy C Norris
(74) *Attorney, Agent, or Firm* — Oblon, McClelland, Maier & Neustadt, L.L.P.

(57) ABSTRACT

A wiring substrate includes an insulating layer including inorganic fillers and resin, and a conductor layer formed on a surface of the insulating layer and having a conductor pattern. The surface of the insulating layer has an arithmetic average roughness Ra in the range of 0.05 μm to 0.5 μm, the conductor layer includes a metal film formed on the surface of the insulating layer, and the inorganic fillers include a first inorganic filler including particles such that each of the particles has a portion of a surface separated from the resin and forming a gap with respect to the resin of the insulating layer and that the metal film of the conductor layer includes part formed in the gap between the first inorganic filler and the resin.

22 Claims, 7 Drawing Sheets

WIRING SUBSTRATE AND METHOD FOR MANUFACTURING WIRING SUBSTRATE

CROSS-REFERENCE TO RELATED APPLICATIONS

The present application is based upon and claims the benefit of priority to Japanese Patent Application No. 2020-134185, filed Aug. 6, 2020, the entire contents of which are incorporated herein by reference.

BACKGROUND OF THE INVENTION

Field of the Invention

The present invention relates to a wiring substrate and a method for manufacturing the wiring substrate.

Description of Background Art

Japanese Patent Application Laid-Open Publication No. 2017-199703 describes a wiring substrate that includes an insulating layer in which inorganic insulating filler is contained in a thermosetting resin. A surface of the insulating layer is roughened to an extent that the inorganic insulating filler is not exposed. An electroless copper plating film is formed on the roughened surface. After an electrolytic copper plating film of a predetermined pattern is formed on the electroless copper plating film, an exposed portion of the electroless copper plating film is removed. The entire contents of this publication are incorporated herein by reference.

SUMMARY OF THE INVENTION

According to one aspect of the present invention, a wiring substrate includes an insulating layer including inorganic fillers and resin, and a conductor layer formed on a surface of the insulating layer and having a conductor pattern. The surface of the insulating layer has an arithmetic average roughness Ra in the range of 0.05 μm to 0.5 μm, the conductor layer includes a metal film formed on the surface of the insulating layer, and the inorganic fillers include a first inorganic filler including particles such that each of the particles has a portion of a surface separated from the resin and forming a gap with respect to the resin of the insulating layer and that the metal film of the conductor layer includes part formed in the gap between the first inorganic filler and the resin.

According to another aspect of the present invention, a method for manufacturing a wiring substrate includes forming an insulating layer including inorganic fillers and resin, roughening a surface of the insulating layer such that the surface has an arithmetic average roughness Ra in the range of 0.05 μm to 0.5 μm, and forming a conductor layer including a metal film on the surface of the insulating layer. The roughening of the surface of the insulating layer includes forming a first inorganic filler including particles such that each of the particles has a portion of a surface separated from the resin and forming a gap with respect to the resin of the insulating layer, and the forming of the conductor layer includes forming the metal film on the surface of the insulating layer such that part of the metal film fills the gap formed between the first inorganic filler and the resin.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
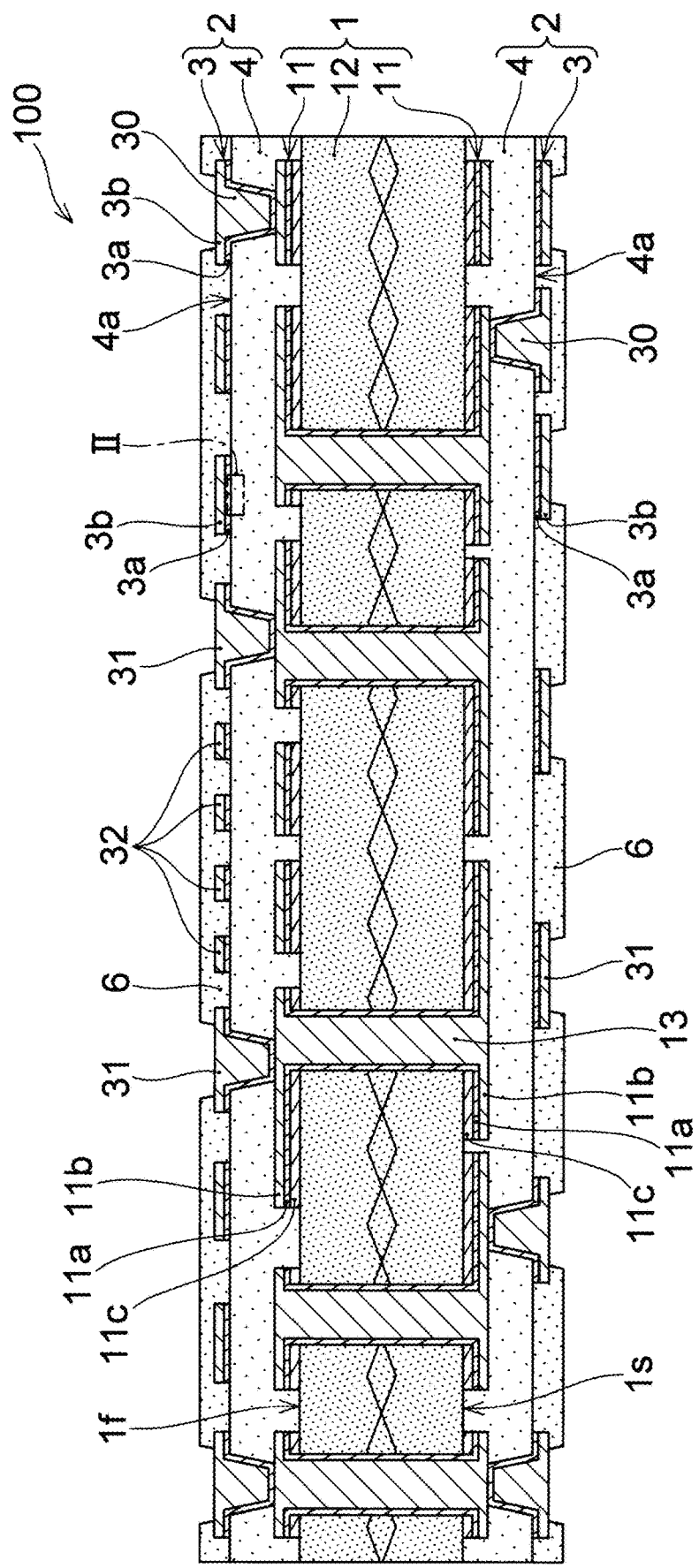
FIG. 1 is a cross-sectional view illustrating an example of a wiring substrate according to an embodiment of the present invention.

Embodiments will now be described with reference to the accompanying drawings, wherein like reference numerals designate corresponding or identical elements throughout the various drawings.

Figure 2:
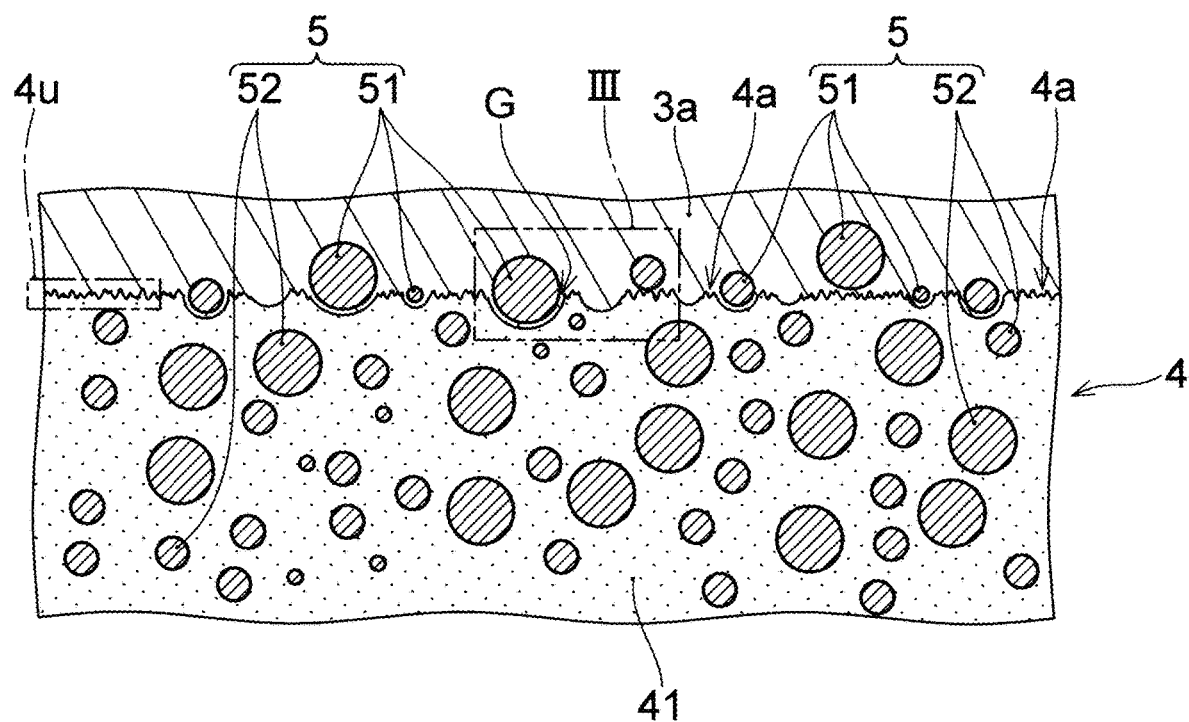
FIG. 2 is a cross-sectional view schematically illustrating a cross section near an interface between an insulating layer and a conductor layer in the wiring substrate according to the embodiment of the present invention.
Figure 3:
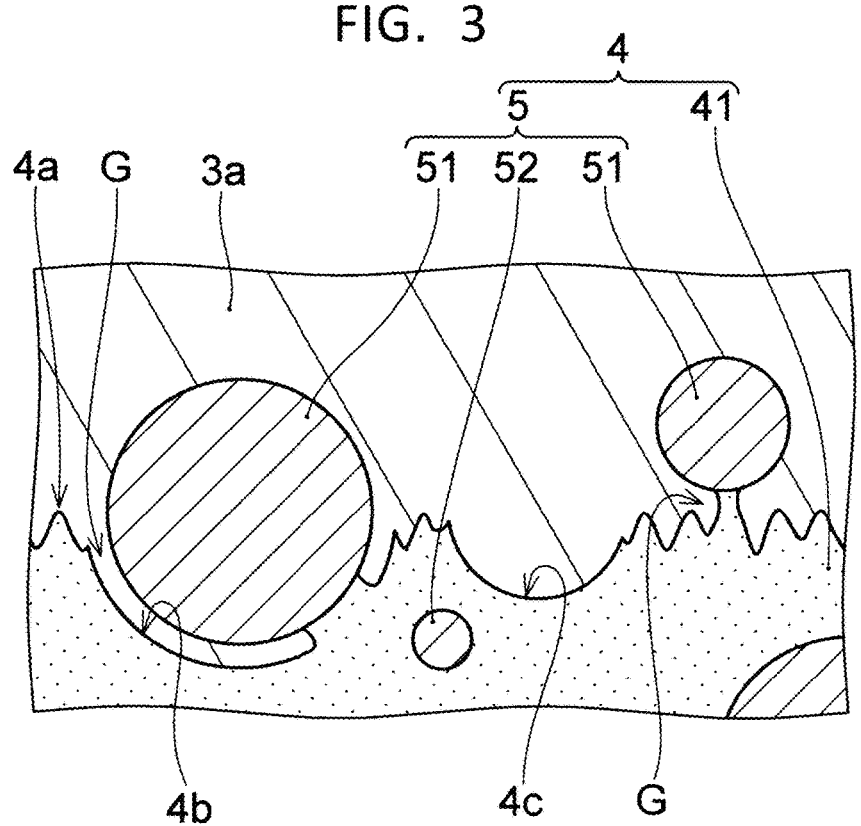
FIG. 3 is an enlarged view of a portion (III) in FIG. 2.

A wiring substrate of an embodiment of the present invention is described with reference to the drawings. FIG. 1 is a cross-sectional view illustrating a wiring substrate 100 which is an example of the wiring substrate of the embodiment. FIG. 2 schematically illustrates an enlarged cross section near an interface between an insulating layer 4 and a conductor layer (metal film (3a)) in the wiring substrate 100 (for example, a portion (II) in FIG. 1). FIG. 3 illustrates a further enlarged view of a portion (III) in FIG. 2. The wiring substrate 100 is merely an example of the wiring substrate of the present embodiment. A laminated structure, the number of conductor layers, and the number of insulating layers of the wiring substrate of the embodiment are not limited to a laminated structure of the wiring substrate 100 of FIG. 1, the number of conductor layers 3 and the number of insulating layers 4 included in the wiring substrate 100.

As illustrated in FIG. 1, the wiring substrate 100 includes a core substrate 1, and build-up layers 2 that are respectively laminated on two main surfaces (a first surface (1f) and a second surface (1s)) of the core substrate 1 opposing each other in a thickness direction of the core substrate 1. The core substrate 1 includes an insulating layer 12, and conductor layers 11 that are respectively formed on both sides of the insulating layer 12. The insulating layer 12 includes through-hole conductors 13 that penetrate the insulating layer 12 and connect the conductor layer 11 on the first surface (1f) side and the conductor layer 11 on the second surface (1s) side to each other.

The build-up layers 2 that are respectively formed on the first surface (1f) and the second surface (1s) of the core substrate 1 each include an insulating layer 4 and a conductor layer 3 formed on a surface (4a) of the insulating layer 4. The insulating layer 4 includes via conductors 30 that penetrate the insulating layer 4 and connect to each other the conductor layer 11 and the conductor layer 3 that are adjacent to each other via the insulating layer 4. The build-up layers 2 in the example of FIG. 1 each include one insulating layer 4 and one conductor layer 3. However, the wiring substrate 100 of the present embodiment can include build-up layers each of which include any number of insulating layers and any number of conductor layers.

In the description of the embodiment, a side farther from the insulating layer 12 in a thickness direction of the wiring substrate 100 is also referred to as an "upper side" or simply "upper," and a side closer to the insulating layer 12 is also referred to as a "lower side" or simply "lower." Further, for the conductor layers and the insulating layers, a surface facing an opposite side with respect to the insulating layer 12 is also referred to as an "upper surface," and a surface facing the insulating layer 12 side is also referred to as a "lower surface."

The insulating layers 4 and the insulating layer 12 each contain any insulating resin. Examples of the insulating resin include an epoxy resin, a bismaleimide triazine resin (BT resin), a phenol resin, and the like. The insulating layers may each contain a core material (reinforcing material) formed of a glass fiber or an aramid fiber. As illustrated in FIGS. 2 and 3, the insulating layers can each further contain inorganic fillers 5 formed of fine particles of silica ($SiO_2$), alumina, mullite, or the like. In the present embodiment, at least the insulating layers 4 each contain multiple inorganic fillers 5.

Each of the conductor layers 3 in the example of FIG. 1 includes a lower layer formed of a metal film (3a) formed on the surface (4a) of the insulating layer 4, and an upper layer formed of a plating film (3b) formed on the metal film (3a). On the other hand, the conductor layers 11 each include a lower layer formed of a metal foil (11c) formed on a surface of the insulating layer 12, a middle layer formed of a metal film (11a) formed on the metal foil (11c), and an upper layer formed of a plating film (11b) formed on the metal film (11a). The metal film (3a) and the metal film (11a) are each, for example, an electroless plating film or a sputtering film. The plating film (3b) and the plating film (11b) are each, for example, an electrolytic plating film. The conductor layers 3 and the conductor layers 11 are each formed using any metal such as copper or nickel.

The via conductors 30 are integrally formed with the conductor layers 3. Therefore, the via conductors 30 are formed of any metal such as copper or nickel similar to the conductor layers 3 and each have a two-layer structure including a metal film (3a) and a plating film (3b) similar to the conductor layers 3. On the other hand, the through-hole conductors 13 are integrally formed with the conductor layers 11. Therefore, the through-hole conductors 13 are formed of any metal such as copper or nickel similar to the conductor layers 11. The through-hole conductors 13 are formed of the metal film (11a) and the plating film (11b) that respectively form the middle layer and the upper layer of the conductor layers 11.

The conductor layers 3 and the conductor layers 11 each include predetermined conductor patterns. In the example of FIG. 1, the conductor layers 3 include conductor pads 31. Electrodes of an active component (not illustrated in the drawings) such as a semiconductor integrated circuit device or a transistor, or a passive component (not illustrated in the drawings) such as an electrical resistance are connected to the conductor pads 31. The conductor pads 31 may be connected to another wiring substrate such as a motherboard of an electrical device in which the wiring substrate 100 is used.

The conductor layer 3 on the first surface (1f) side of the core substrate 1 includes multiple wiring patterns 32 adjacent to each other. In the wiring substrate 100, as will be described later, insulation between the conductor patterns included in the conductor layer 3 is thought to be improved. That is, a short circuit failure between the wiring patterns 32 is thought to be unlikely to occur. Therefore, the multiple wiring patterns 32 can be arranged with narrow wiring width and interval. For example, the multiple wiring patterns 32 can be arranged according to a wiring rule of 10 μm/10 μm, regarding a wiring rule defined by a combination (L/S) of a minimum wiring width (L) and a minimum wiring interval (S). Therefore, the conductor layer 3 can include the multiple wiring patterns 32 having a (minimum wiring width (L))/(minimum wiring interval (S)) of 10 μm/10 μm.

A solder resist 6 is formed on the insulating layer 4 and the conductor layer 3 on each of the first surface (1f) side and the second surface (1s) side of the core substrate 1. Openings exposing the conductor pads 31 are provided in the solder resist 6. The solder resist 6 is formed of, for example, a photosensitive epoxy resin or polyimide resin, or the like. A surface protection film (not illustrated in the drawings) may be provided on surfaces of the conductor pads 31 exposed in the openings of the solder resist 6 to prevent corrosion or oxidation of the surfaces of the conductor pads 31. The surface protection film can have, for example, a single-layer structure or a multilayer structure formed of Au, Ni/Au, Ni/Pd/Au or the like.

As illustrated in FIG. 2, the surface (4a) of the insulating layer 4 has fine unevenness (4u). As will be described later, the unevenness (4u) is formed by subjecting the surface (4a) to a roughening treatment using, for example, a chemical method.

The insulating layer 4 of the wiring substrate 100 contains multiple inorganic fillers 5 and a resin part 41 surrounding the multiple inorganic fillers 5. The resin part 41 contains as a main component an epoxy resin, a BT resin, a phenol resin, or the like exemplified above as a resin forming the insulating layer 4. By adding the inorganic fillers 5 formed of silica, alumina, or the like to the resin, mechanical strength and/or thermal conductivity of the insulating layer 4 may be increased. Further, by adjusting an additive amount of the inorganic fillers 5, it may be possible to adjust a thermal expansion coefficient of the insulating layer 4.

In the wiring substrate 100 of the present embodiment, the multiple inorganic fillers 5 include first inorganic filler 51. The first inorganic filler 51 is inorganic filler that is a part of the multiple inorganic fillers 5 and is inorganic filler that has portions separated away from the resin part 41 of the insulating layer 4 on surfaces of the inorganic fillers 5. That is, at least portions of surfaces of the first inorganic filler 51 are separated away from the resin part 41 and are not in contact with the resin part 41. The surfaces of the first inorganic filler 51 have portions that are not in contact with the resin part 41. As illustrated in FIGS. 2 and 3, the multiple inorganic fillers 5 include the first inorganic filler 51.

That inorganic filler 5 is "separated away from the resin part 41" means that portions of the surfaces of the inorganic filler 5 opposing (facing) the resin part 41 is not in contact with the resin part 41. That is, a state is intended in which portions of the surfaces of the inorganic filler 5 opposing the resin part 41 is not in contact with the resin part 41 even though it opposes the resin part 41. Therefore, inorganic filler 5 of which only portions of surfaces opposing the conductor layer 3 (metal film (3a)) are not in contact with the resin part 41 does not belong to the first inorganic filler 51.

In the examples of FIGS. 2 and 3, the multiple inorganic fillers 5 also include inorganic fillers that are not the first inorganic filler 51. Among the multiple inorganic fillers 5, inorganic filler other than the first inorganic filler 51 is also referred to as second inorganic filler 52. The second inorganic filler 52 is inorganic filler of which entire surface portions facing the resin part 41 is in contact with the resin part 41. The second inorganic filler 52 is substantially wholly surrounded by the resin part 41 and is substantially wholly embedded in the insulating layer 4.

Although the surfaces of the first inorganic filler 51 includes portions separated away from the resin part 41, as illustrated in FIG. 3, portions of the surfaces of the first inorganic filler 51 may be in contact with the resin part 41. The surfaces of at least some of the first inorganic filler 51 are partially in contact with the resin part 41 and are connected to the resin part 41. That is, at least some of the first inorganic filler 51 are connected to a main body portion of the insulating layer 4 (a portion other than the first inorganic filler 51 in the insulating layer 4). Since such first inorganic filler 51 is contained in the insulating layer 4, it is thought that adhesion strength between the metal film (3a), that is, the conductor layer 3 and the insulating layer 4 is improved. The reason for this is described below.

Since portions of the surfaces of the first inorganic filler 51 are separated away from the resin part 41, as illustrated in FIG. 3, there are gaps (G) between the first inorganic filler 51 and the resin part 41 which forms the main body portion of the insulating layer 4. The gaps (G) exist on the surface (4a) of the insulating layer 4. Then, the metal film (3a) forming the conductor layer 3 is formed on the surface (4a). Since the gaps (G) exist on the surface (4a), as illustrated in FIGS. 2 and 3, part of the metal film (3a) is formed (in the gaps (G)) between the first inorganic filler 51 and the resin part 41. That is, part (the metal film (3a)) of the conductor layer 3 is formed not only on surfaces of the resin part 41 and the inorganic fillers 5 facing the metal film (3a), but is also formed between the first inorganic filler 51 and the resin part 41.

On the other hand, as described above, some of the first inorganic filler 51 are connected to the resin part 41 that forms the main body portion of the insulating layer 4. Therefore, when the metal film (3a) is formed in the gaps (G), it is thought that a substantial contact area between the metal film (3a) (a part of the conductor layer 3) and the insulating layer 4 increases. Further, it is thought that a movement of the metal film (3a) formed in the gaps (G) from the surface (4a) of the insulating layer 4 in a peeling direction is hindered by the first inorganic filler 51. Therefore, it is thought that the adhesion strength between the metal film (3a), that is, the conductor layer 3, and the insulating layer 4 is improved.

From such a point of view of improving the adhesion strength between the conductor layer 3 and the insulating layer 4, the metal film (3a) is preferably formed using a method that allows the metal film (3a) to be also easily formed in the gaps (G). For example, the metal film (3a) may be an electroless plating film formed by electroless plating. In electroless plating performed in a plating solution, it is thought that the metal film (3a) can be easily formed in the gaps (G) as compared to sputtering or the like.

The surface (4a) of the insulating layer 4 includes multiple recesses (4b) that are recessed toward an opposite side with respect to the metal film (3a). Some of the first inorganic filler 51 partially enter into the recesses (4b). When the first inorganic filler 51 is in the recesses (4b), contact areas of the part of the metal film (3a) formed in the gaps (G) with the first inorganic filler 51 and with the resin part 41 of the insulating layer 4 are increased. Therefore, it is thought that the adhesion strength between the conductor layer 3 and the insulating layer 4 is further improved. The recesses (4b) that partially contain the first inorganic filler 51 are formed by removing the resin part 41 around the first inorganic filler 51.

There are also recesses (4c), in which the first inorganic filler 51 is not present, on the surface (4a) of the insulating layer 4. Even in such recesses (4c), the contact area of the metal film (3a) with the insulating layer 4 is increased at least as compared to that in a case of a flat portion. Therefore, it is thought that the recesses (4c) that do not contain the first inorganic filler 51 also contribute to the improvement of the adhesion strength between the conductor layer 3 and the insulating layer 4. The recesses (4c) that do not contain the first inorganic filler 51 can be formed, for example, by removing the inorganic fillers 5 exposed on the surface (4a) of the insulating layer 4.

Figure 4:
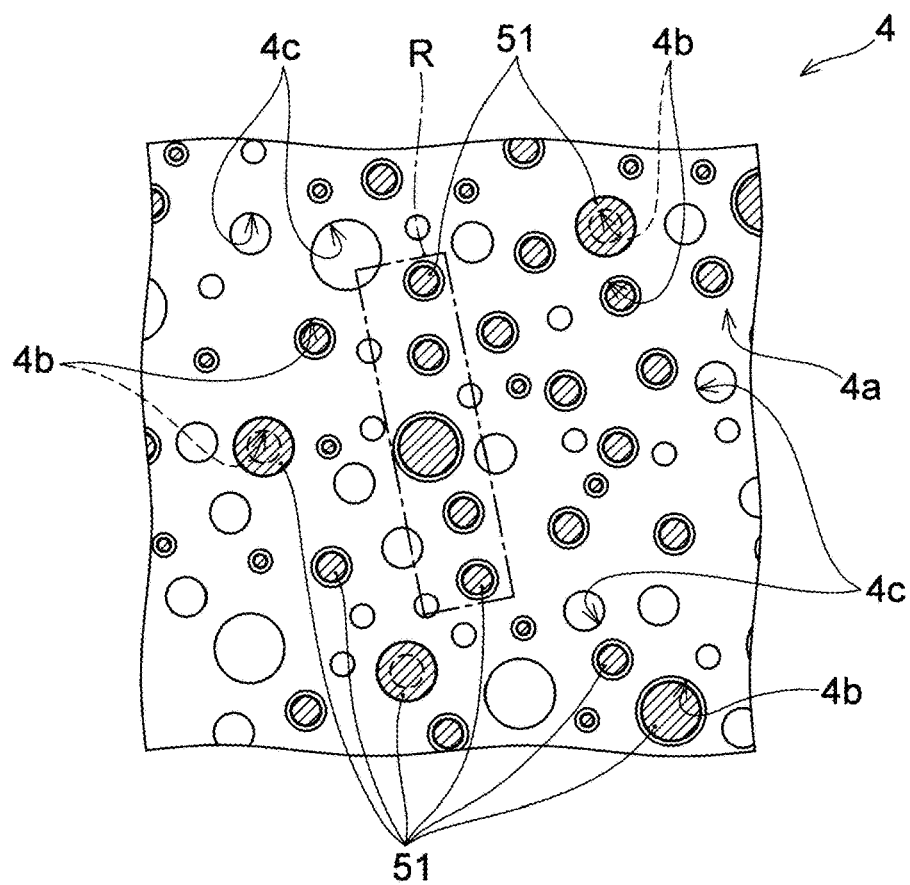
FIG. 4 is a plan view schematically illustrating a surface of the insulating layer in the wiring substrate according to the embodiment of the present invention.

FIG. 4 schematically illustrates the surface (4a) of the insulating layer 4 of the wiring substrate 100. Although FIG. 4 is a plan view, the first inorganic filler 51 is hatched with diagonal lines for ease of understanding. As illustrated in FIG. 4, the first inorganic filler 51 is exposed on the surface (4a) of the insulating layer 4. Further, the multiple recesses (4b) and the multiple recesses (4c) are formed on the surface (4a). Some of the first inorganic filler 51 enter into the recesses (4b). Recesses (4b) illustrated with broken lines are recesses (4b) hidden by the first inorganic filler 51.

In the wiring substrate 100 of the present embodiment, the surface (4a) of the insulating layer 4 may include a region in which there are 5 or more first inorganic fillers 51 per 10 µm. For example, in FIG. 4, a region (R) of which a contour is indicated with a two-dot chain line includes five first inorganic fillers 51 along a longitudinal direction of the region (R). Here, the region R has a length shorter than 10 µm in the longitudinal direction. That is, there are at least 5 first inorganic fillers 51 per 10 µm in the region (R). The surface (4a) of the insulating layer 4 in the example of FIG. 4 includes a region, such as the region (R), in which there are 5 or more first inorganic fillers 51 per 10 µm (an arrangement density of five first inorganic fillers 51 per 10 µm is referred to as a "density (D)" in the following). In the example of FIG. 4, since the first inorganic fillers 51 exist on the surface (4a) of the insulating layer 4 at a density equal to or higher than the density (D), a sufficient effect of improving the adhesion strength between the conductor layer 3 and the insulating layer 4 described above due to the first inorganic fillers 51 can be obtained.

A region in which the first inorganic fillers 51 are present at a density equal to or higher than the density (D) is preferably present on the surface (4a) at an interface between the insulating layer 4 and a conductor pattern of the conductor layer 3. However, when a region that includes the first inorganic fillers 51 at a density equal to or higher than the density (D) exists on the surface (4a), it is thought that a region that includes the first inorganic fillers 51 at a density close to the density (D) also exists at an interface portion with the conductor layer 3 on the surface (4a). Therefore, the surface (4a) can have a region that includes the first inorganic fillers 51 at a density equal to or higher than the density (D) at any location.

As described above, in the present embodiment, since the insulating layer 4 contains the multiple inorganic fillers 5 including the first inorganic filler 51 and a part of the metal film (3a) is formed between the first inorganic filler 51 and the resin part 41, it is thought that the adhesion strength between the conductor layer 3 and the insulating layer 4 is improved. In addition, when the surface (4a) of the insulating layer 4 includes the first inorganic filler 51 at a density equal to or higher than the density (D), it is thought that the adhesion strength between the conductor layer 3 and the insulating layer 4 is further improved. Even when the wiring width of the wiring patterns 32 (see FIG. 1) becomes smaller with miniaturization of the wiring patterns, it is thought that the wiring patterns 32 are unlikely to peel off from the insulating layer 4. Further, even when the additive amount of the inorganic fillers 5 is increased in order to reduce the thermal expansion coefficient of the insulating layer 4, it is thought that the wiring patterns 32 are unlikely to peel off from the insulating layer 4.

On the other hand, in the wiring substrate 100 of the present embodiment, the surface (4a) of the insulating layer 4 has an arithmetic average roughness (Ra) of 0.05 µm or more and 0.5 µm or less. Since the surface (4a) of the insulating layer 4 has such a relatively small surface roughness, unwanted portions (portions that do not form the conductor patterns of the conductor layer 3) of the metal film (3a) formed on the surface (4a) can be easily removed as intended. That is, since a deep recess that makes removal of the metal film (3a) formed therein difficult is unlikely to exist on the surface (4a), the unwanted portions of the metal film (3a) can be appropriately removed by, for example, etching. Therefore, the insulation between the conductor patterns (for example, the wiring patterns 32 and the like) of the conductor layer 3 is unlikely to deteriorate, and a short-circuit failure is unlikely to occur.

Further, since the surface roughness of the surface (4a) of the insulating layer 4 is relatively small, it is thought that a surface roughness of the conductor layer 3 on the insulating layer 4 side is also relatively small. Therefore, for example, in transmission of a high frequency signal, even when a transmission signal is affected by a skin effect, it is thought that deterioration in transmission characteristics or the like due to a substantial increase in impedance is unlikely to occur.

The surface (4a) of the insulating layer 4 has an arithmetic average roughness (Ra) of 0.05 µm or more and 0.5 µm or less as an average value of the entire surface (4a). Therefore, the surface (4a) can have an arithmetic average roughness (Ra) of 0.05 µm or more and 0.5 µm or less, for example, for a surface roughness measured from one end of the surface (4a) to the other end on an opposite side with respect to the one end. That is, the surface (4a) of the insulating layer 4 has an arithmetic average roughness (Ra) of 0.05 µm or more and 0.5 µm or less as a surface roughness including the first inorganic filler 51. The average value of the arithmetic average roughness (Ra) of the entire surface (4a) may be obtained as an average value of arithmetic average roughnesses (Ra) measured at all five places including four corner portions and a center portion of the surface (4a).

When the insulating layer has a relatively small arithmetic average roughness (Ra) of 0.05 µm-0.5 µm at an interface with the conductor layer, the anchor effect expected in Japanese Patent Application Laid-Open Publication No. 2017-199703 described above is small and it is possible that desired adhesion strength between the conductor layer and the insulating layer is not obtained. However, in the present embodiment, as described above, due to the first inorganic filler 51, the adhesion strength between the insulating layer 4 and the conductor layer 3 is improved. Therefore, even when the surface (4a) of the insulating layer 4 has an arithmetic average roughness (Ra) of 0.05 µm or more and 0.5 µm or less, desired adhesion strength between the conductor layer 3 and the insulating layer 4 can be easily obtained. Therefore, according to the present embodiment, it may be possible to improve the insulation between conductor patterns such as the wiring patterns 32 while suppressing a decrease in adhesion strength between the insulating layer 4 and the conductor layer 3.

For example, when the conductor patterns such as the wiring patterns 32 are arranged according to a wiring rule of 30 µm/30 µm, even when the surface (4a) of the insulating layer 4 has an arithmetic average roughness (Ra) of 0.5 µm, it is thought that a short-circuit failure is unlikely to occur between the conductor patterns. On the other hand, when the surface (4a) of the insulating layer 4 has an even smaller arithmetic average roughness (Ra) of 0.05 µm, even when the conductor patterns such as the wiring patterns 32 are arranged according to the wiring rule of 10 µm/10 µm described above, it is thought that a short circuit failure is unlikely to occur between the conductor patterns. Therefore, the conductor patterns such as the wiring patterns 32 included in the conductor layer 3 can have a (minimum wiring width (L))/(minimum wiring interval (S)) of 3 µm/3 µm or more and 20 µm/20 µm or less.

A content rate of the multiple inorganic fillers 5 in the insulating layer 4 is, for example, 30% or more and 80% or less. When the inorganic fillers 5 are present in the insulating layer 4 at such a content rate, it is thought that the first inorganic fillers 51 are likely to be present at a density equal to or higher than the density (D) described above, and that a predetermined function due to the resin part 41 such as a binding function between the inorganic fillers 5 can be appropriately exhibited. In FIGS. 2-4, the inorganic fillers 5 are each drawn as having a spherical shape. However, the inorganic fillers 5 can each have any shape. The inorganic fillers 5 each have a particle size of about 0.01 µm-5 µm.

A maximum depth of the recesses (4c), which are formed on the surface (4a) of the insulating layer 4 and do not contain the first inorganic fillers 51, is thought to be about half a maximum particle size of the inorganic fillers 5. On the other hand, a maximize height of the first inorganic fillers 51, which are substantially entirely positioned on the surface (4a), relative to the surface (4a) of the insulating layer 4 can substantially correspond to the maximum particle size of the inorganic fillers 5. Therefore, a maximum value of the unevenness of the surface (4a) in a region in which the first inorganic fillers 51 and the recesses (4c) are present is thought to be about 1.5 times the maximum particle size of the inorganic fillers 5.

As described above, the surface (4a) of the insulating layer 4 has an arithmetic average roughness (Ra) of 0.05 µm or more and 0.5 µm or less as an average value also including a region in which the first inorganic fillers 51 are present. Therefore, the surface (4a) can have an even smaller surface roughness in a region in which the first inorganic fillers 51 are not present and the above-described unevenness (4u) (see FIG. 2) is present. On the surface (4a) of the insulating layer 4, a maximum height difference of unevenness in a region in which the first inorganic fillers 51 and recesses (4c) are not present may be 0.01 or more and 0.5 or less times a maximum height difference of unevenness in a region in which the first inorganic fillers 51 and the recesses (4c) are present. It is thought that good adhesion strength between the conductor layer 3 and the insulating layer 4 can be obtained and an effect of preventing a short-circuit failure between the conductor patterns of the conductor layer 3 can be obtained as intended.

Figure 5A:
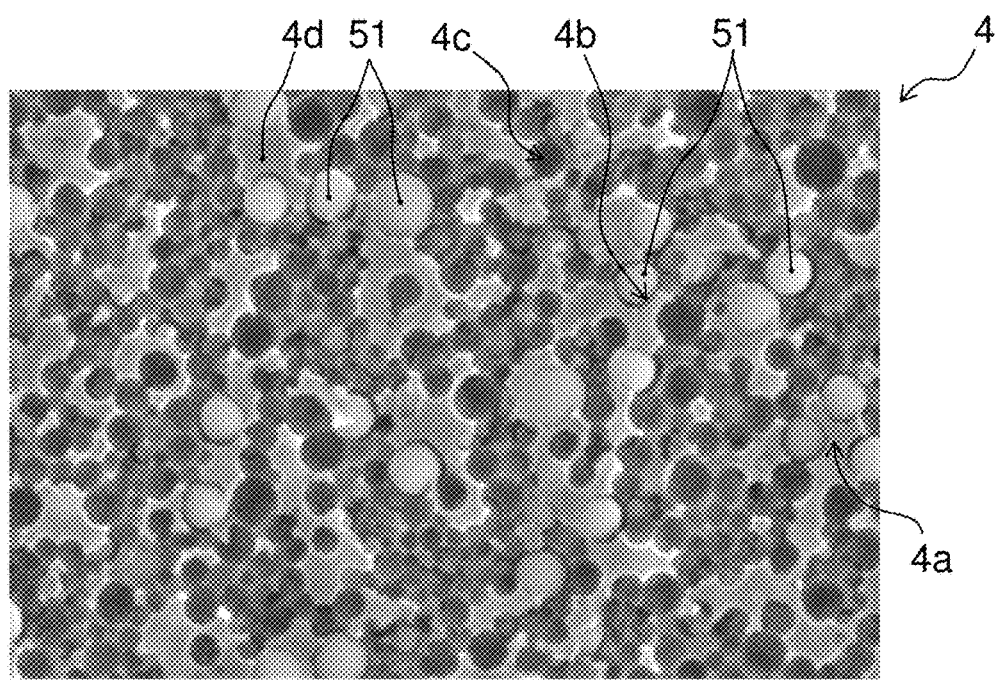
FIG. 5A is a photographed image of a surface of an insulating layer in a working example of the present invention.
Figure 5B:
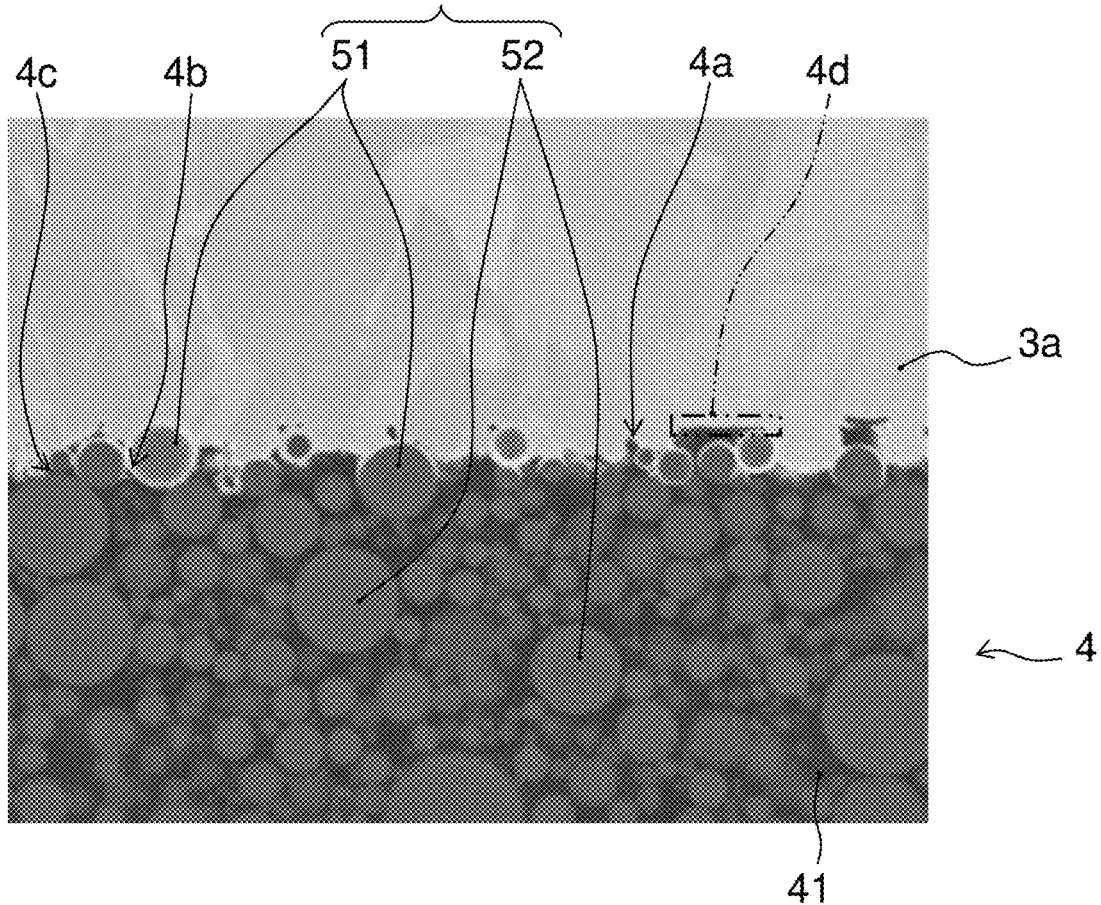
FIG. 5B is a photographed image of a cross section near an interface between the insulating layer and a conductor layer in the working example of the present invention.

FIG. 5A shows a photographed image of the surface (4a) of the insulating layer 4 in a working example of the wiring substrate of the embodiment. FIG. 5B shows a photographed image of a cross section near an interface between the insulating layer 4 and the conductor layer (metal film (3a)) in the working example of the wiring substrate of the embodiment.

As shown in FIGS. 5A and 5B, the insulating layer 4 contains the multiple inorganic fillers 5, and some (the first inorganic fillers 51) of the inorganic filler 5 each have a portion that is separated away from the resin part 41 of the insulating layer 4. The insulating layer 4 contains the multiple first inorganic fillers 51. The surface (4a) of the insulating layer 4 includes the recesses (4b) that contain the first inorganic fillers 51, the recesses (4c) that do not contain the first inorganic fillers 51, and flat portions (4d). The flat portions (4d) are each a portion that does not include the recesses (4b) and the recesses (4c) and includes only a fine unevenness due to a roughening treatment.

As shown in FIG. 5B, the metal film (3a) is also formed between the first inorganic fillers 51 and the resin part 41. Some of the multiple first inorganic fillers 51 appear to be completely separated away from the resin part 41. However, those first inorganic fillers 51 may be connected to the resin part 41 in unphotographed regions. As shown in the working example of FIGS. 5A and 5B, since the wiring substrate of the present embodiment contains first inorganic fillers 51, good adhesion strength between the conductor layer 3 (metal film (3a)) and the insulating layer 4 can be obtained.

Next, a method for manufacturing the wiring substrate of the embodiment is described with reference to FIGS. 6A-6G, using the wiring substrate 100 of FIG. 1 as an example.

Figure 6A:
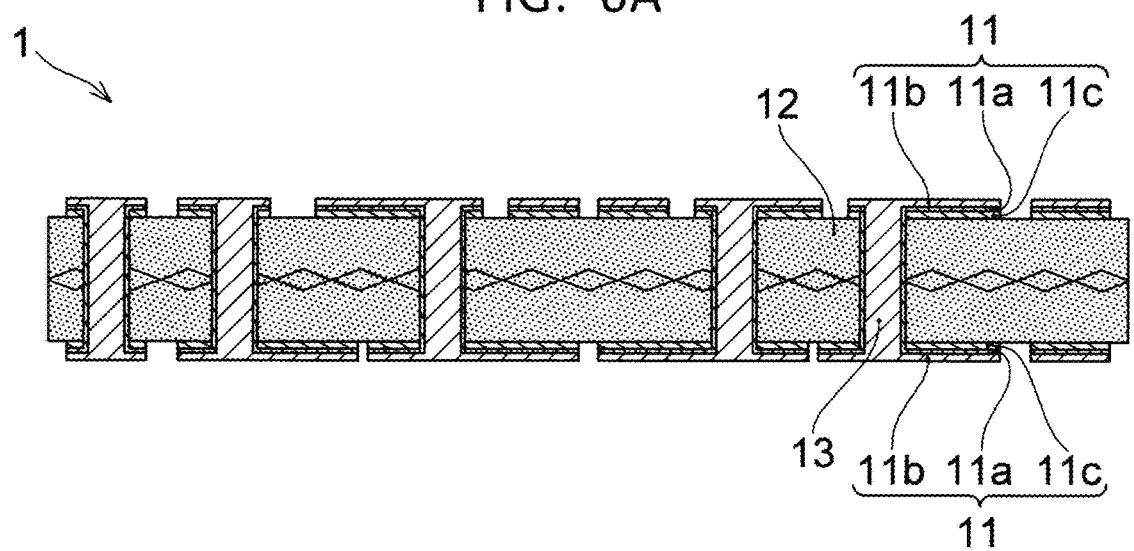
FIG. 6A is a cross-sectional view illustrating an example of a manufacturing process of a wiring substrate according to an embodiment of the present invention.

As illustrated in FIG. 6A, a starting substrate (for example, a double-sided copper-clad laminated plate) that includes an insulating layer, which is to become the insulating layer 12 of the core substrate 1, and the metal foils (11c) that are respectively laminated on both sides of the insulating layer is prepared, and the conductor layers 11 and the through-hole conductors 13 of the core substrate 1 are formed. For example, through holes are formed at formation positions of the through-hole conductors 13 by drilling or irradiation of $CO_2$ laser, and the metal film (11a) is formed in the through holes and on the metal foils (11c) by electroless plating or sputtering. Then, the plating film (11b) is formed by electrolytic plating using the metal film (11a) as a power feeding layer. As a result, the conductor layers 11, each having a three-layer structure, and the through-hole conductors 13 are formed. After that, the core substrate 1 having predetermined conductor patterns is obtained by patterning the conductor layers 11 using a subtractive method.

Figure 6B:
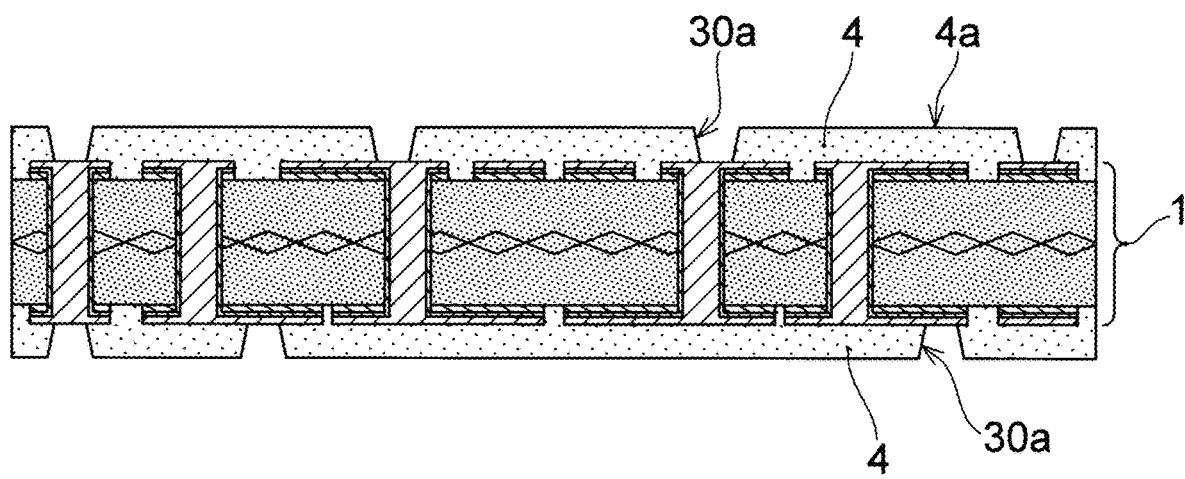
FIG. 6B is a cross-sectional view illustrating an example of the manufacturing process of a wiring substrate according to the embodiment of the present invention.
Figure 6C:
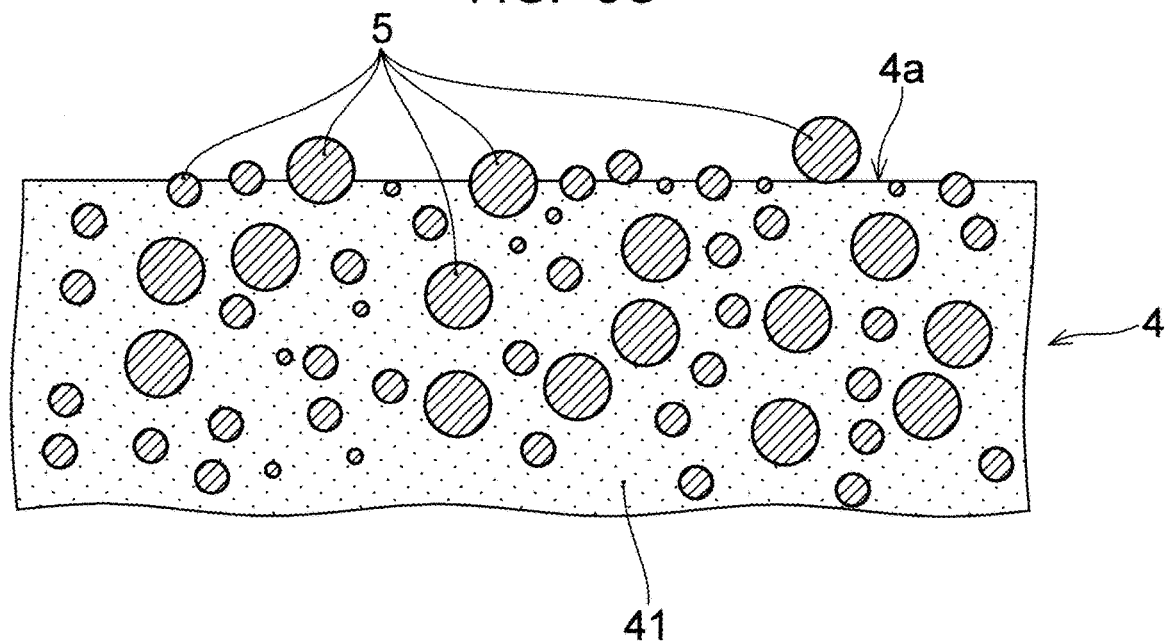
FIG. 6C is a cross-sectional view illustrating an example of the manufacturing process of a wiring substrate according to the embodiment of the present invention.

As illustrated in FIGS. 6B and 6C, the method for manufacturing the wiring substrate of the present embodiment includes forming the insulating layer 4 that contains the multiple inorganic fillers 5 and the resin part 41 surrounding the multiple inorganic fillers 5. FIG. 6C illustrates an enlarged cross section of the insulating layer 4 near the surface (4a) in the state of FIG. 6B.

In the formation of the insulating layer 4, for example, a film-like epoxy resin is laminated on core substrate 1 and is heated and pressed. As a result, the insulating layer 4 is formed. For the formation of the insulating layer 4, a film-like resin in which the multiple inorganic fillers 5 are contained in a resin such as an epoxy resin is used. By using such a film-like resin, the insulating layer 4 containing the multiple inorganic fillers 5 and the resin part 41 is formed. For example, an epoxy resin containing the inorganic fillers 5 at a content rate of 30%-80% is used. The resin part 41 of the insulating layer 4 is formed by a resin component formed of an epoxy resin or the like in the film-like resin. The insulating layer 4 can be formed of any resin such as a BT resin or a phenolic resin that contains the multiple inorganic fillers 5. In the insulating layer 4, through holes (30a) for forming the via conductors are formed by, for example, irradiation with $CO_2$ laser. As illustrated in FIG. 6C, the multiple inorganic fillers 5 are present inside the insulating layer 4 and near the surface (4a). Some of the multiple inorganic fillers 5 are substantially entirely or partially exposed from the surface (4a) of the insulating layer 4. As illustrated in FIG. 6C, until after the formation of the through holes (30a), the insulating layer 4 can have a substantially flat surface (4a) except for portions where the inorganic fillers 5 are present.

After the formation of the through holes (30a), when necessary, a desmear treatment is performed in which resin residues (smears) generated by the formation of the through holes (30a) are removed. For example, the smears in the through holes (30a) are removed by exposing inner walls of the through holes (30a) to a treatment liquid such as an alkaline permanganate solution. In the desmear treatment, the surface (4a) of the insulating layer 4 can also be exposed to the treatment liquid.

Figure 6D:
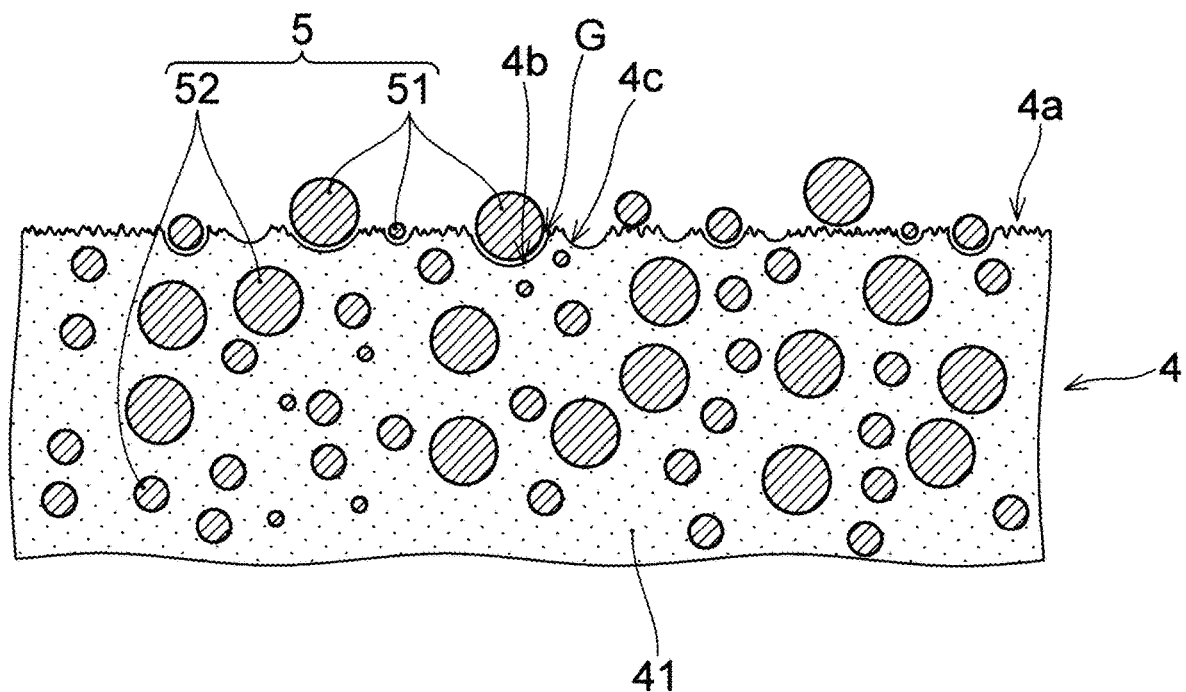
FIG. 6D is a cross-sectional view illustrating an example of the manufacturing process of a wiring substrate according to the embodiment of the present invention.

As illustrated in FIG. 6D, the method for manufacturing the wiring substrate of the present embodiment includes roughening the surface (4a) of the insulating layer 4. The surface (4a) of the insulating layer 4 is roughened to have a predetermined surface roughness. Similar to FIG. 6C, FIG. 6D illustrates an enlarged cross section of the insulating layer 4 near the surface (4a). By the roughening of the surface (4a), the adhesion strength between the insulating layer 4 and the conductor layer 3 (see FIG. 6G) formed on the surface (4a) is improved to some extent.

The surface (4a) of the insulating layer 4 is subjected to an alkaline permanganate solution treatment using a treatment liquid similar to that used in the above-described desmear treatment. As a result, the surface (4a) is roughened to have a desired surface roughness. The surface (4a) of the insulating layer 4 may be roughened to a desired surface roughness in the desmear treatment described above.

As illustrated in FIG. 6D, in the method for manufacturing the wiring substrate of the present embodiment, the roughening of the surface (4a) of the insulating layer 4 includes providing the first inorganic filler 51, which is an inorganic filler that is partially separated away from the resin part 41 of the insulating layer 4. Inside the insulating layer 4, the second inorganic filler 52, which is an inorganic filler 5 other than the first inorganic filler 51, remain in the state before the roughening of the surface (4a). In the example of FIG. 6D, due to the roughening of the surface (4a), the recesses (4b) that partially contain the first inorganic fillers 51 and the recesses (4c) that do not contain the first inorganic fillers 51 are formed on the surface (4a).

The first inorganic fillers 51 are provided by forming a partial gap (G) between each of some inorganic fillers 5, which are among the multiple inorganic fillers 5 and are present on the surface (4a) of the insulating layer 4, and the resin part 41. That is, in the roughening treatment of the surface (4a) of the insulating layer 4, the resin part 41 forming the surface (4a) of the insulating layer 4 is selectively dissolved, and the dissolved portion is removed. By selectively removing the resin part 41 around the inorganic fillers 5 that are present near the surface (4a) in the roughening treatment, the inorganic fillers 5 that each have a surface partially separated away from the resin part 41, that is, the first inorganic fillers 51, are provided. Further, the recesses (4b) can be formed along with providing the first inorganic fillers 51. Regarding the surfaces of the inorganic fillers 5, "separated away from the resin part 41" means that, as described above, a portion of a surface of an inorganic filler 5 opposing (facing) the resin part 41 is not in contact with the resin part 41.

In the roughening of the surface (4a) of the insulating layer 4, the surface (4a) is roughened to have an arithmetic average roughness (Ra) of 0.05 μm or more and 0.5 μm or less. The surface (4a) may be roughened to have an arithmetic average roughness (Ra) of 0.05 μm or more and 0.5 μm or less and include a region in which 5 or more first inorganic fillers 51 are present per 10 μm. That is, a roughening condition of the surface (4a) is adjusted such that the surface (4a) has an arithmetic average roughness (Ra) of 0.05 μm or more and 0.5 μm or less, and preferably, at least a portion of the surface (4a) is provided with 5 or more first inorganic fillers 51 per 10 μm. The surface (4a) is roughened to have an arithmetic average roughness (Ra) of 0.05 μm or more and 0.5 μm or less as an average value of the entire surface (4a) as a surface roughness including also the first inorganic fillers 51.

The roughening treatment of the surface (4a) of the insulating layer 4 may be performed using a general procedure and under a general condition. However, for example, in a roughening treatment based on an alkaline permanganate solution treatment, a swelling treatment using a swelling liquid, an oxidation treatment using an oxidizing agent (substantial roughening treatment), and a neutralization treatment using a neutralizing liquid can be performed. As the swelling liquid, for example, a sodium hydroxide solution or a potassium hydroxide solution is used. The insulating layer 4 is exposed to the swelling liquid at a predetermined temperature for a predetermined time. As the oxidizing agent, for example, an alkaline permanganate solution containing permanganate at a predetermined concentration is used. The insulating layer 4 is exposed to the solution at a predetermined temperature for a predetermined time. As the neutralizing liquid, an acidic aqueous solution is used. The surface (4a) of the insulating layer 4 roughened by the oxidation treatment is exposed to the neutralizing liquid at a predetermined temperature for a predetermined time. For example, conditions such as a treatment time, a temperature of a treatment liquid, and/or a concentration of a main component in the treatment liquid in each treatment during the series of roughening treatments are appropriately selected. As a result, the surface (4a) of the insulating layer 4 can be roughened such that the surface (4a) has the desired arithmetic average roughness (Ra) described above, and preferably, in at least a portion of the surface (4a), the first inorganic fillers 51 are provided at a desired density equal to or higher than the density (D) (five first inorganic fillers 51 per 10 μm).

Further, by removing the resin part 41 around the first inorganic fillers 51 in order to provide the first inorganic fillers 51, the recessions (4b) can be formed. Further, some of the inorganic fillers 5 exposed on the surface (4a) may be completely removed by appropriately selecting a condition of the roughening treatment of the surface (4a). In this way, by removing some of the inorganic fillers 5, the recesses (4c) can be formed.

After the roughening of the surface (4a) of the insulating layer 4, cleaning may be performed. For example, the wiring substrate during manufacturing is cleaned by ultrasonic cleaning. By ultrasonic cleaning, a state of the surface (4a) of the insulating layer 4 may be further brought closer to a desired state. For example, it is possible that excessive first inorganic fillers 51 on the surface (4a) are removed by ultrasonic cleaning, and instead, the recesses (4c) are formed.

Figure 6E:
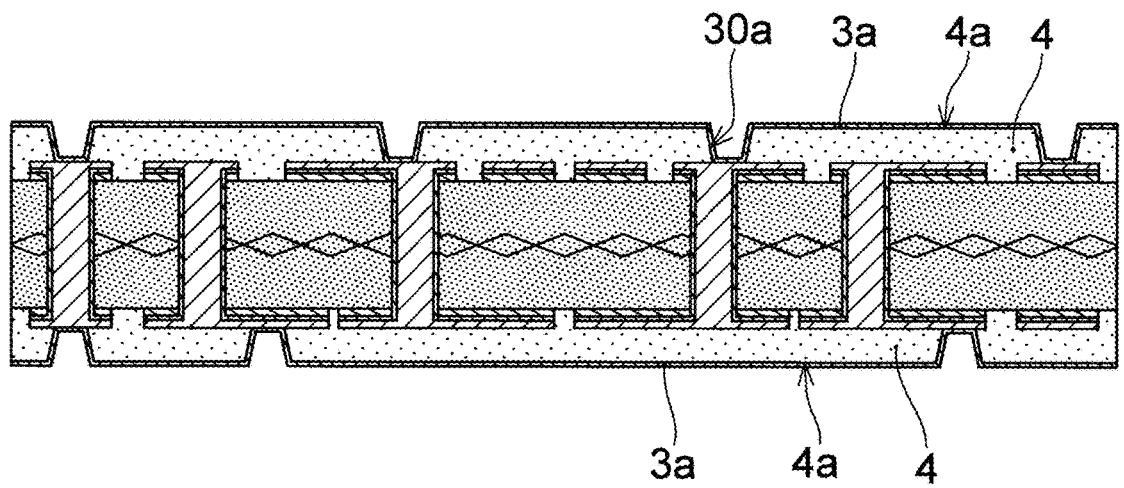
FIG. 6E is a cross-sectional view illustrating an example of the manufacturing process of a wiring substrate according to the embodiment of the present invention.
Figure 6F:
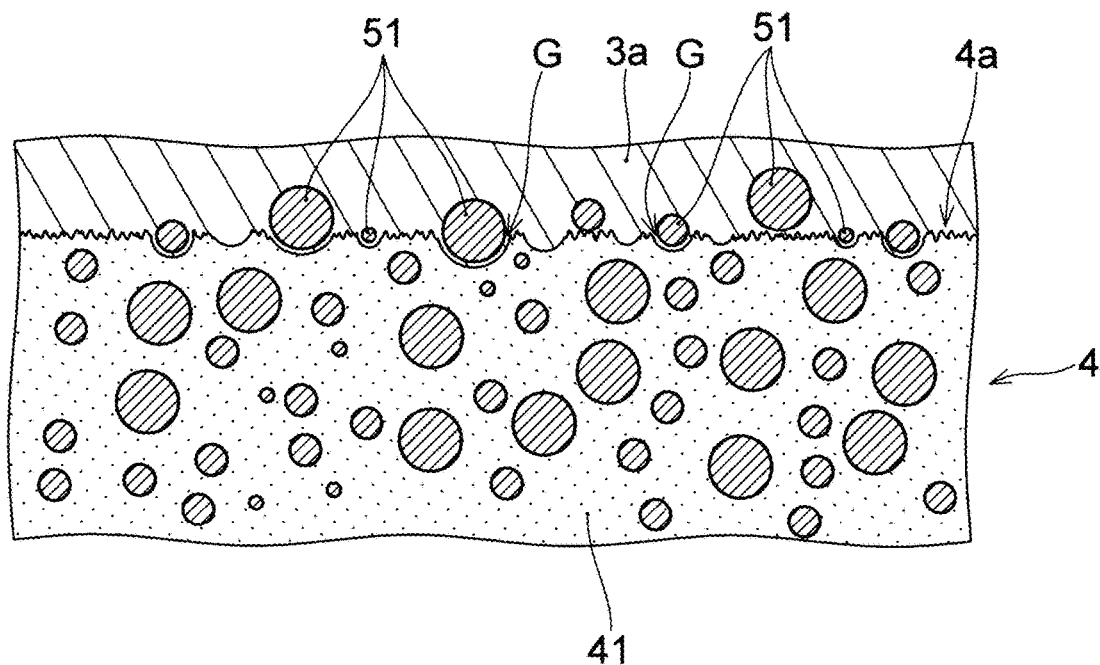
FIG. 6F is a cross-sectional view illustrating an example of the manufacturing process of a wiring substrate according to the embodiment of the present invention.
Figure 6G:
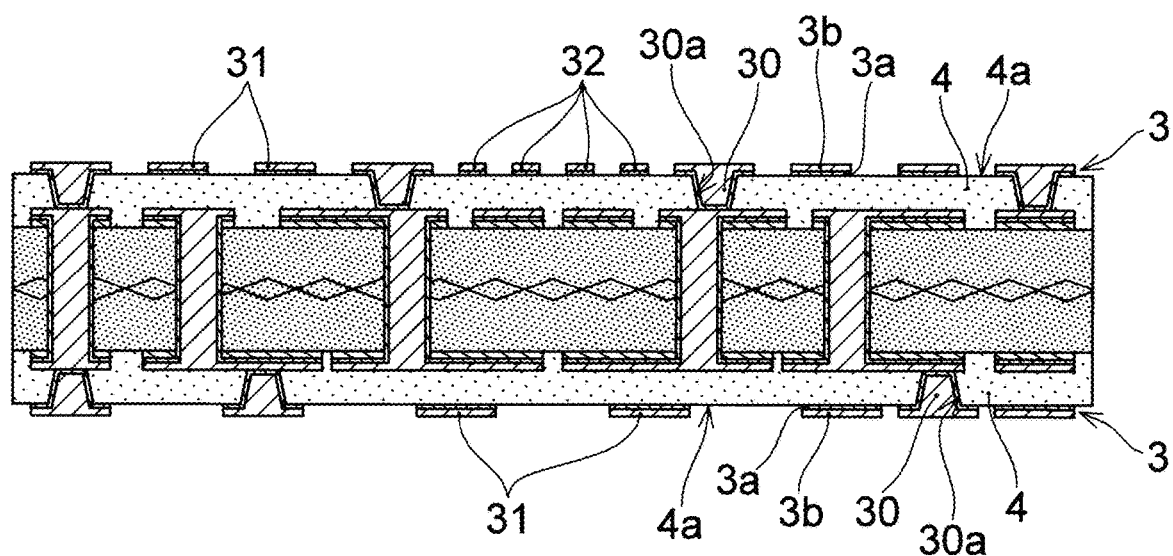
FIG. 6G is a cross-sectional view illustrating an example of the manufacturing process of a wiring substrate according to the embodiment of the present invention.

As illustrated in FIGS. 6E-6G, the method for manufacturing the wiring substrate of the present embodiment includes forming the conductor layer 3 on the surface (4a) of the insulating layer 4. Then, as illustrated in FIGS. 6E and 6F, the forming of the conductor layer 3 includes forming the metal film (3a) on the surface (4a) of insulating layer 4, and filling the gaps (G) between the first inorganic fillers 51 and the resin part 41 with a part of the metal film (3a). In the example of FIGS. 6E-6G, the conductor layer 3 is formed using a semi-additive method. FIG. 6F illustrates an enlarged cross section of an interface portion between the insulating layer 4 and the metal film (3a) in the state of FIG. 6E.

The metal film (3a) is formed on the surface (4a) of the insulating layer 4 and on the entire inner walls of the through holes (30a) using any metal such as copper or nickel. Further, as illustrated in FIG. 6F, the metal film (3a) can also be formed in the gaps (G) between the first inorganic fillers 51 and the resin part 41 of the insulating layer 4. By forming the metal film (3a) also in the gaps between the first inorganic fillers 51 and the resin part 41, the adhesion strength between the insulating layer 4 and the conductor layer 3 (see FIG. 6G) can be improved.

The metal film (3a) is formed using any method such as electroless plating or sputtering. However, the metal film (3a) is preferably formed by electroless plating. In the formation of the metal film (3a) by electroless plating, the metal film (3a) can be easily formed also in the gaps (G) between the first inorganic fillers 51 and the resin part 41 of the insulating layer 4.

As illustrated in FIG. 6G, after the formation of the metal film (3a), the plating film (3b) is formed on the metal film (3a) in a desired pattern. The plating film (3b) is formed by pattern plating including electrolytic plating using the metal film (3a) as a power feeding layer. That is, a plating resist (not illustrated in the drawings) having openings corresponding to desired conductor patterns to be included in the conductor layer 3 is provided on the metal film (3a). Then, a plating metal is deposited by electrolytic plating in the openings of the plating resist including the through holes (30a) of the insulating layer 4. As a result, the plating film (3b) is formed in the openings of the plating resist. The via conductors 30 are formed in the through holes (30a). The plating film (3b) is formed using the same material as the metal film (3a) such as copper or nickel. The conductor layer 3 that has a lower layer formed of the metal film (3a) and an upper layer formed of the plating film (3b) and includes desired conductor patterns is formed.

After that, the plating resist is removed, and the unwanted portions of the metal film (3a) that are not covered by the plating film (3b) are removed by, for example, etching. In the present embodiment, since the surface (4a) of the insulating layer 4 is roughened to have a relatively small arithmetic average roughness (Ra) of 0.05 µm or more and 0.5 µm or less, the unwanted portions of the metal film (3a) can be easily and appropriately removed. As a result, the conductor layer 3 that has a two-layer structure and includes the desired conductor patterns such as the conductor pads 31 and the wiring patterns 32 is formed.

After that, the solder resist 6 (see FIG. 1) is formed on the conductor layer 3 and the insulating layer 4. The openings exposing the conductor pads 31 are provided in the solder resist 6. The solder resist layer and the openings thereof are formed by, for example, forming a resin layer containing a photosensitive epoxy resin or polyimide resin or the like, and performing exposure and development using a mask having appropriate patterns. The surface protection film (not illustrated in the drawings) may be formed on the conductor pads 31 by electroless plating, solder leveling, or spray coating. Through the above processes, the wiring substrate 100 in the example of FIG. 1 is completed.

According to the method for manufacturing the wiring substrate of the present embodiment, the insulating layer 4 having the surface (4a) that has an arithmetic average roughness (Ra) of 0.05 µm or more and 0.5 µm or less is formed, and the gaps (G) between the first inorganic fillers 51 (which are separated away from the resin part 41 of the insulating layer 4) and the resin part 41 are filled with a part of the metal film (3a). Therefore, it is thought that the wiring substrate 100 having good adhesion strength between the insulating layer 4 and the conductor layer 3 and having good insulation between the conductor patterns of the conductor layer 3 is manufactured.

The wiring substrate of the embodiment is not limited to those having the structures illustrated in the drawings and those having the structures, shapes, and materials exemplified in the present specification. As described above, the wiring substrate of the embodiment can have any laminated structure. For example, the wiring substrate of the embodiment may be a coreless substrate that does not contain a core substrate. The wiring substrate of the embodiment can have any number of conductor layers and any number of insulating layers. The conductor layer 3 does not have to include a plating film (3b) formed of an electrolytic plating film, and may include, for example, only the metal film (3a) formed of an electroless plating film. Further, all the multiple first inorganic fillers 51 may partially or wholly enter into the recesses (recesses (4b)) on the surface (4a) of the insulating layer 4.

The method for manufacturing the wiring substrate of the embodiment is not limited the method described with reference to the drawings. For example, the conductor layer 3 may be formed using a full additive method. Further, the insulating layer 4 may be formed using a resin in any form that contains the inorganic fillers 5 without being limited to a film-like resin. Further, it is also possible that the via conductors 30 are not formed in the insulating layer 4. In the method for manufacturing the wiring substrate of the embodiment, it is also possible that any process other than the processes described above is added, or some of the processes described above are omitted.

In the wiring substrate described in Japanese Patent Application Laid-Open Publication No. 2017-199703, the electroless copper plating film is formed on the uneven surface of the insulating layer after roughening, and the insulating layer and the electroless copper plating film are locked to each other by an anchor effect. However, the electroless copper plating film formed in a deep part of the surface unevenness of the roughened insulating layer may remain in a portion exposed from the electrolytic copper plating film without being removed. In this case, there is a risk that insulation between wiring patterns on the insulating layer may decrease. On the other hand, when the surface roughness of the insulating layer is small, a sufficient anchor effect is not obtained, and adhesion strength between the insulating layer and the electroless copper plating film may decrease.

A wiring substrate according to an embodiment of the present invention includes: an insulating layer that contains multiple inorganic fillers and a resin part surrounding the multiple inorganic fillers; and a conductor layer that is formed on a surface of the insulating layer and includes a predetermined conductor pattern. The conductor layer includes a metal film formed on the surface. The surface has an arithmetic average roughness (Ra) of 0.05 µm or more and 0.5 µm or less. The multiple inorganic fillers include a first inorganic filler having portions on the surface that is separated away from the resin part. A part of the metal film is formed between the first inorganic filler and the resin part.

A method for manufacturing a wiring substrate according to an embodiment of the present invention includes: forming an insulating layer that contains multiple inorganic fillers and a resin part surrounding the multiple inorganic fillers; roughening a surface of the insulating layer; and forming a conductor layer on the surface of the insulating layer. The roughening of the surface includes providing a first inorganic filler that is partially separated away from the resin part by forming a partial gap between an inorganic filler, which is among the multiple inorganic fillers and is present on the surface, and the resin part. The surface is roughened to have an arithmetic average roughness (Ra) of 0.05 µm or more and 0.5 µm or less. The forming of the conductor layer includes forming a metal film on the surface and filling the gap with a part of the metal film.

According to an embodiment of the present invention, insulation between wiring patterns is improved while suppressing a decrease in adhesion strength between an insulating layer and a conductor layer.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring substrate, comprising:
   an insulating layer comprising a plurality of inorganic fillers and resin; and
   a conductor layer formed on a surface of the insulating layer and having a conductor pattern,
   wherein the surface of the insulating layer has an arithmetic average roughness Ra in a range of 0.05 µm to 0.5 µm, the conductor layer includes a metal film formed on the surface of the insulating layer, the plurality of inorganic fillers includes a first inorganic filler comprising particles such that each of the particles has a portion of a surface separated from the resin and forming a gap with respect to the resin of the insulating layer and that the metal film of the conductor layer includes part formed in the gap between the first inorganic filler and the resin, and the conductor pattern of the conductor layer includes a wiring pattern formed such that a combination L/S of a minimum wiring width L and a minimum wiring interval S of the wiring pattern has the minimum wiring width L in a range of 3 μm to 20 μm and the minimum wiring interval S in a range of 3 μm to 20 μm.

2. The wiring substrate according to claim 1, wherein the surface of the insulating layer includes a region in which 5 or more of the particles of the first inorganic filler are present per 10 μm.

3. The wiring substrate according to claim 2, wherein the metal film is an electroless plating film.

4. The wiring substrate according to claim 2, wherein the insulating layer is formed such that a content rate of the plurality of inorganic fillers is in a range of 30% to 80%.

5. The wiring substrate according to claim 2, wherein the insulating layer is formed such that the surface of the insulating layer includes recesses recessed toward an opposite side with respect to the metal film and that the particles of the first inorganic filler are at least partially in the recesses.

6. The wiring substrate according to claim 1, wherein the metal film is an electroless plating film.

7. The wiring substrate according to claim 6, wherein the insulating layer is formed such that a content rate of the plurality of inorganic fillers is in a range of 30% to 80%.

8. The wiring substrate according to claim 6, wherein the insulating layer is formed such that the surface of the insulating layer includes recesses recessed toward an opposite side with respect to the metal film and that the particles of the first inorganic filler are at least partially in the recesses.

9. The wiring substrate according to claim 1, wherein the insulating layer is formed such that a content rate of the plurality of inorganic fillers is in a range of 30% to 80%.

10. The wiring substrate according to claim 9, wherein the insulating layer is formed such that the surface of the insulating layer includes recesses recessed toward an opposite side with respect to the metal film and that the particles of the first inorganic filler are at least partially in the recesses.

11. The wiring substrate according to claim 1, wherein the insulating layer is formed such that the surface of the insulating layer includes recesses recessed toward an opposite side with respect to the metal film and that the particles of the first inorganic filler are at least partially in the recesses.

12. A method for manufacturing a wiring substrate, comprising:
    forming an insulating layer comprising a plurality of inorganic fillers and resin;
    roughening a surface of the insulating layer such that the surface has an arithmetic average roughness Ra in a range of 0.05 μm to 0.5 μm; and
    forming a conductor layer comprising a metal film on the surface of the insulating layer,
    wherein the roughening of the surface of the insulating layer includes forming a first inorganic filler comprising particles such that each of the particles has a portion of a surface separated from the resin and forming a gap with respect to the resin of the insulating layer, and the forming of the conductor layer includes forming the metal film on the surface of the insulating layer such that part of the metal film fills the gap formed between the first inorganic filler and the resin, and forming a conductor pattern including a wiring pattern such that a combination L/S of a minimum wiring width L and a minimum wiring interval S of the wiring pattern has the minimum wiring width L in a range of 3 μm to 20 μm and the minimum wiring interval S in a range of 3 μm to 20 μm.

13. The method for manufacturing a wiring substrate according to claim 12, wherein the roughening of the surface of the insulating layer includes roughening the surface of insulating layer such that the surface includes a region in which 5 or more of the particles of the first inorganic filler are present per 10 μm.

14. A wiring substrate, comprising:
    an insulating layer comprising a plurality of inorganic fillers and resin; and
    a conductor layer formed on a surface of the insulating layer and having a conductor pattern.
    wherein the surface of the insulating layer has an arithmetic average roughness Ra in a range of 0.05 μm to 0.5 μm, the conductor layer includes a metal film formed on the surface of the insulating layer, the plurality of inorganic fillers includes a first inorganic filler comprising particles such that each of the particles has a portion of a surface separated from the resin and forming a gap with respect to the resin of the insulating layer and that the metal film of the conductor layer includes part formed in the gap between the first inorganic filler and the resin, and the insulating layer is formed such that the surface of the insulating layer includes recesses recessed toward an opposite side with respect to the metal film and that the particles of the first inorganic filler are at least partially in the recesses.

15. The wiring substrate according to claim 14, wherein the surface of the insulating layer includes a region in which 5 or more of the particles of the first inorganic filler are present per 10 μm.

16. The wiring substrate according to claim 15, wherein the metal film is an electroless plating film.

17. The wiring substrate according to claim 15, wherein the insulating layer is formed such that a content rate of the plurality of inorganic fillers is in a range of 30% to 80%.

18. The wiring substrate according to claim 14, wherein the metal film is an electroless plating film.

19. The wiring substrate according to claim 18, wherein the insulating layer is formed such that a content rate of the plurality of inorganic fillers is in a range of 30% to 80%.

20. The wiring substrate according to claim 14, wherein the insulating layer is formed such that a content rate of the plurality of inorganic fillers is in a range of 30% to 80%.

21. A method for manufacturing a wiring substrate, comprising:
    forming an insulating layer comprising a plurality of inorganic fillers and resin;
    roughening a surface of the insulating layer such that the surface has an arithmetic average roughness Ra in a range of 0.05 μm to 0.5 μm; and
    forming a conductor layer comprising a metal film on the surface of the insulating layer,
    wherein the insulating layer is formed such that the surface of the insulating layer includes recesses recessed toward an opposite side with respect to the metal film and that the particles of the first inorganic filler are at least partially in the recesses, the roughening of the surface of the insulating layer includes forming a first inorganic filler comprising particles such that each of the particles has a portion of a surface separated from the resin and forming a gap with respect to the resin of the insulating layer, and the forming of the conductor layer includes forming the metal film on the surface of the insulating layer such that part of the metal film fills the gap formed between the first inorganic filler and the resin.

22. The method for manufacturing a wiring substrate according to claim 21, wherein the roughening of the surface of the insulating layer includes roughening the surface of insulating layer such that the surface includes a region in which 5 or more of the particles of the first inorganic filler are present per 10 μm.

* * * * *